(12) United States Patent
Michel et al.

(10) Patent No.: US 7,768,164 B2
(45) Date of Patent: Aug. 3, 2010

(54) HEAT PIPE DEVICE FOR COOLING A VOLTAGE REGULATOR OF A ROTATING ELECTRIC MACHINE, SUCH AS AN ALTERNATOR OR AN ALTERNATOR-STARTER

(75) Inventors: Fakes Michel, Seclin (FR); Claudiu Vasilescu, Paris (FR); Daniel Richard, Saint Antoine (FR)

(73) Assignee: Valeo Equipements Electriques Moteur, Creteil (FR)

( * ) Notice: Subject to any disclaimer, the term of this patent is extended or adjusted under 35 U.S.C. 154(b) by 0 days.

(21) Appl. No.: 12/093,538

(22) PCT Filed: Dec. 7, 2006

(86) PCT No.: PCT/FR2006/051307

§ 371 (c)(1),
(2), (4) Date: Nov. 6, 2008

(87) PCT Pub. No.: WO2007/066048

PCT Pub. Date: Jun. 14, 2007

(65) Prior Publication Data

US 2009/0160272 A1 Jun. 25, 2009

(30) Foreign Application Priority Data

Dec. 8, 2005 (FR) .................................. 0512468

(51) Int. Cl.
*H02K 9/00* (2006.01)

(52) U.S. Cl. ............................ 310/68 D; 310/52; 310/64
(58) Field of Classification Search ............... 310/68 D, 310/52–64
See application file for complete search history.

(56) References Cited

U.S. PATENT DOCUMENTS

| 4,295,067 | A | * | 10/1981 | Binder et al. | .................. 310/52 |
| 4,955,944 | A | * | 9/1990 | Aso et al. | ................. 123/41.31 |
| 6,169,344 | B1 | | 1/2001 | Tsuruhara | |
| 2006/0279144 | A1 | * | 12/2006 | Mukai et al. | .................. 310/52 |

FOREIGN PATENT DOCUMENTS

| EP | 0 731 550 A2 | 9/1996 |
| FR | 2 745 445 | 8/1997 |
| JP | 56-108098 | 8/1981 |
| JP | 63-262044 | 10/1988 |
| JP | 4-145860 | 5/1992 |
| JP | 7-170695 | 7/1995 |

* cited by examiner

*Primary Examiner*—Dang D Le
(74) *Attorney, Agent, or Firm*—Berenato & White, LLC (57) ABSTRACT

A heat pipe device (6) for cooling a voltage regulator (2) of a rotating electric machine. The heat pipe device (6) comprises an evaporating part (7) situated respectively in a hot zone and connected to the voltage regulator (2) of the machine, and condensation part situated in a cold zone. The heat pipe device (6) is suitable for an alternator or an alternator-starter. The heat pipe is provided to discharge the heat from the hot zone to the cold zone.

16 Claims, 4 Drawing Sheets

HEAT PIPE DEVICE FOR COOLING A VOLTAGE REGULATOR OF A ROTATING ELECTRIC MACHINE, SUCH AS AN ALTERNATOR OR AN ALTERNATOR-STARTER

CROSS-REFERENCE TO RELATED APPLICATIONS AND CLAIM TO PRIORITY

This application relates to International Application No. PCT/FR2006/051307 filed Dec. 7, 2006 and French Patent Application No. 0512468 filed Dec. 8, 2005, of which the disclosures are incorporated herein by reference and to which priority is claimed.

FIELD OF THE INVENTION

The invention concerns a cooling device comprising a heat pipe, the evaporation part of which is situated in a hot zone and the condensation part in a cold zone, the said heat pipe being intended to discharge the heat from the hot zone to the cold zone.

PRIOR ART

In these cooling devices the evaporation part absorbs heat and the condensation part discharges the heat.

OBJECT OF THE INVENTION

The aim of the present invention is to take advantage of the heat pipe.

To achieve this aim, the cooling device according to the invention is characterised in that the evaporation part of the heat pipe is connected to a voltage regulator belonging to a rotary electrical machine such as an alternator or an alternator starter.

By virtue of the invention the voltage regulator is properly cooled so that the performance of the rotary electrical machine is increased, along with its service life.

The invention makes it possible to increase the power of the machine, and this simply and economically.

According to one characteristic the heat pipe comprises, between these evaporation and condensation parts, an electrically insulating part so that the hot and cold zones are insulated electrically from each other.

Thus the condensation part of the heat pipe can be connected to the positive dissipator of a rectifying device.

According to one characteristic the condensation part of the heat pipe is located close to a connection terminal connected by a cable to the positive terminal of a battery so that the heat is properly discharged.

SUMMARY DESCRIPTION OF THE DRAWINGS

The invention will be better understood, and other aims, characteristics, details and advantages thereof will emerge more clearly during the following explanatory description made with reference to the accompanying schematic drawings, given solely by way of example, illustrating an embodiment of the invention and in which.

DESCRIPTION OF THE INVENTION

The invention will be described below in its application to a rear bearing housing of a rotary electrical machine. This application is however given only by way of example.

This rotary electrical machine is for example a polyphase alternator in particular for a motor vehicle. This alternator comprises a hollow-shaped casing comprising at least one front bearing housing and one rear bearing housing. This casing is intended to be mounted on a fixed part.

Inside there are housed a stator surrounding a rotor fixed to a shaft mounted for rotation in the casing by means of bearings, such as ball bearings, carried centrally respectively by the rear bearing housing and the front bearing housing.

The stator comprises a grooved stator body carrying a stator coil comprising windings, the number of which varies according in particular to the number of phases that the alternator has. The body of the stator is carried by the casing, being located at the external periphery thereof. This body consists for example of a packet of metal sheets.

An air gap exists between the internal periphery of the stator body and the external periphery of the rotor.

The rotor is for example a claw rotor or a projecting-pole rotor.

The shaft passes centrally through the rotor while being rotationally connected to it for example by force-fitting, the shaft comprising for this purpose at least one portion with reliefs force-fitted in the central opening that the rotor has for this purpose.

The front end of the shaft passes through the front bearing housing and carries a drive member such as a pulley or a toothed wheel belonging to a movement transmission device, for example with belt(s) or chain(s), acting between the shaft of the alternator and the crankshaft of the motor vehicle thermal engine.

The rotor comprises a rotor body, preferably made from ferromagnetic material. At least one excitation coil is associated with the body. When the excitation coil is supplied electrically, the rotor body is magnetised with the formation of magnetic poles, the rotor body being configured accordingly.

An induced current in the stator coil is then produced when the shaft turns.

This induced current is of the alternating type so that a rectifying device is provided, such as a diode bridge or a transistor bridge of the MOSFET type, in order to transform the alternating current into direct current in order to electrically supply at least one load, such as a load belonging to the onboard system of the vehicle and/or a battery.

The rectifying device is provided with several arms and is usually carried by the rear bearing housing of the rotary electrical machine. This device comprises a positive dissipator carrying positive rectifying elements, for example positive diodes, a negative dissipator carrying negative rectifying elements, such as negative diodes, and a connector made from electrically insulating material carrying electrical connections for electrically connecting the rectifying elements together in order to form arms of the rectifying device, such as a diode bridge, and to electrically connect the outputs of the windings, connected for example in star or delta, of the stator coil to the rectifying device.

The negative dissipator is electrically connected to earth while the positive dissipator carries an output terminal, referred to as the B+ terminal, intended to be connected to the positive terminal of the battery.

These dissipators are in one embodiment metal. Advantageously the negative dissipator is formed by the hollow-shaped rear bearing housing bottom.

The excitation coil of the rotor is electrically connected to a voltage regulator in order to limit the voltage produced by the alternator and protect the loads.

In one embodiment the alternator is brushless and the excitation coil is fixed. In another embodiment the alternator has brushes and the excitation coil is carried by the rotor body.

In this case the rear end of the shaft carries two collecting rings connected by hard-wired connections to the ends of the excitation coil.

Brushes are intended to rub on the collecting rings. These brushes are mounted in a brush holder usually belonging to a brush holder regulator assembly also carried by the rear bearing housing.

By way of example reference should be made to the document WO 02/29958 disclosing, in the context of an alternator with brushes and with a rectifying device in the form of a diode bridge, such an arrangement more clearly visible in FIGS. 7 and 14 to 17 of this document.

In this document the rotor is a claw rotor provided with a body comprising two pole pieces between which there is interposed a core carrying the excitation coil. This alternator is cooled by air. To do this the rotor carries a fan at each of its axial ends and the front and rear bearing housings of the casing are provided with air inlet and outlet openings for the internal circulation of the air by means of fans.

This air circulation cools the stator windings as well as the rectifying bridge and the voltage regulator/brush holder assembly covered by a perforated protective cap and fixedly connected to the rear bearing housing.

The voltage regulator comprises a subassembly comprising for example a substrate on which at least one elementary voltage regulating electronic component such as a chip is mounted.

This regulator regulates the voltage supplying the battery and loads. It may be of the single-function type or of the multifunction type in order in particular to dialogue with at least one computer and/or to detect faults, such as the detection of absence of rotation or the detection of breakage of the belt.

Figure 1:
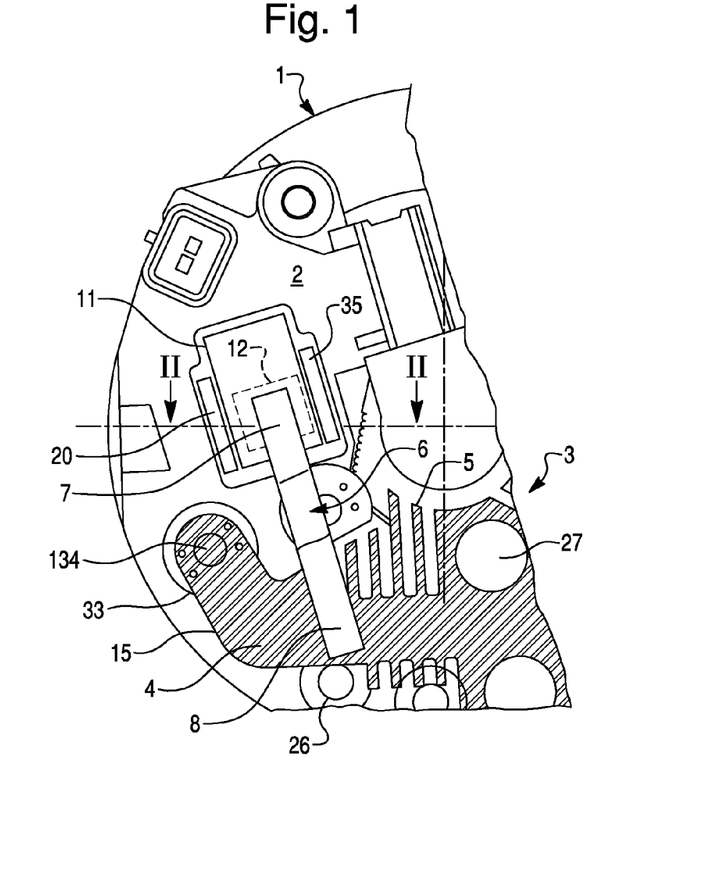
FIG. 1 is a plan view of a part of a rear bearing housing of a rotary electrical machine and illustrates schematically an embodiment of the invention.

FIG. 1 shows a part of the rear bearing housing, designated by 1, of a rotary electrical machine, with a conventional structure, for example of the type described in the aforementioned document WO 02/29958.

This rear bearing housing 1 is therefore hollow in shape and comprises a bottom, visible in FIG. 1, provided centrally with air passage openings and extended at its external periphery by a peripheral rim adjacent to the stator. This rim is also provided with air passage openings.

FIG. 1 does not depict the protective cap covering the rectifying device, here a diode bridge, in order to show better the parts covered by this cap.

Thus, in this figure, there are indicated at 2 the assembly comprising the voltage regulator and the brush-holder, at 33 a lug belonging to the positive dissipator 4 belonging to the rectifying device 3, comprising here rectifying elements in the form of diodes. The negative dissipator consists here of the bottom of the rear bearing housing carrying diodes 26, referred to as negative diodes, some of which are visible in FIG. 1.

The positive dissipator 4, advantageously metal, also carries diodes 27, referred to as positive diodes. A connector, not visible, acts between the two dissipators. The positive dissipator 4 is provided here with cooling fins 5.

The aim of the invention consists of providing the cooling of the voltage regulator 2.

In accordance with the invention, the cooling is achieved by means of a heat pipe 6, the evaporation part 7 of which is connected to the voltage regulator constituting a hot source, while the condensation part 8 is connected to a cold source of the rotary electrical machine. The parts 7 and 8 are electrically conductive.

The heat pipe 6 is connected directly or indirectly to the electronic regulation component of the voltage regulator in order to cool it.

In this FIG. 1 the cold source is the positive dissipator 4 of the rectifying device 4 electrically insulated here by the rear bearing housing 1. The condensation part 8 of the heat pipe is mounted on the positive dissipator 4, or more precisely in the vicinity of the cooling fins 5 of the dissipator 4.

This condensation part is also located in the vicinity of the lug 33 of the dissipator 4. This lug 33 serves for the mounting of the B+ terminal attached for example by screwing on the lug 33 with a hole for this purpose. In FIG. 1 this hole can be seen at 134. This terminal is connected by a cable to the positive terminal of the battery constituting a cold source. The cable therefore makes it possible to discharge the heat so that the lug 33 is a cold source.

The condensation part 8 is therefore here located in the vicinity of the lug 37, being in contact with and secured to the dissipator 4, which is at a positive potential.

The condensation part 8 of the heat pipe 6 is therefore mounted close to a cold zone of the positive dissipator 4 well cooled by virtue of the fins 5.

Figure 2:
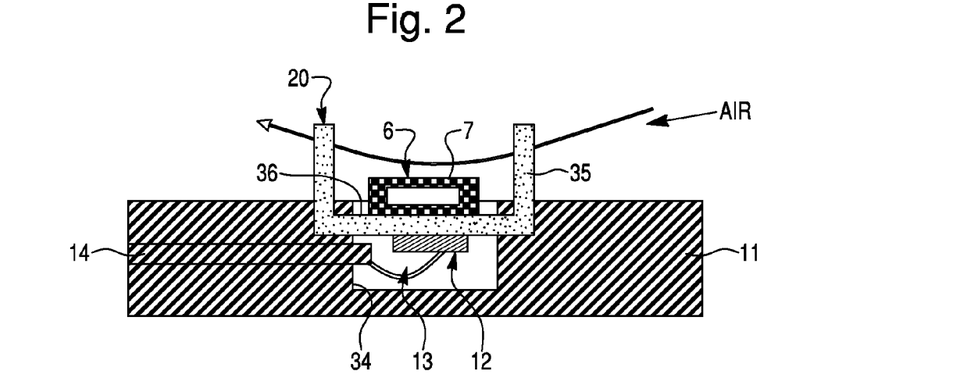
FIG. 2 is a partial view in section along the line II-II in FIG. 1.

The evaporation part 7 of the heat pipe 6 is mounted on the voltage regulator, for example as illustrated in FIG. 2, which shows at 11 a layer of plastics material belonging to the voltage regulator and disposed on the rear bearing housing 1, and at 12 at least one electronic regulation component, such as a chip, for the voltage regulator, whose housing is connected by an electrical connection wire 13 to at least one metal electrical connection track 14 connected to a reference potential. This track 14 extends in the layer 11.

In the case shown, the evaporation part 7 of the heat pipe 6 is in indirect contact with the chip 12 and is mounted on a heat dissipating plate 20, but any other known mounting possibility, such as a mounting on a heat dissipator with cooling fins, can be envisaged. The plate 20 is secured to the layer 11.

More precisely the heat dissipating plate 20 is here metal and has a U-shaped cross-section with two wings 35 and a bottom 36. The heat pipe 6 extends through its part 7 in contact with the top face of the bottom 36 while the chip 12 extends in contact with the bottom face of the bottom 36. The evaporation part 7 and the chip 12 therefore extend on each side of the bottom 36. This part 7 of the heat pipe 6 and the chip 12 are fixed to the bottom 36 of the plate 20 for example by means of a heat-conducting adhesive. In a variant these components are fixed to the bottom 36 by brazing.

It will be noted that the layer 11 has a cavity 34 for housing the chip 12, the part 7, most of the bottom 36, the connection wire 13 and the visible free end of the track 14 electrically connected to the wire 13.

The ends of the bottom 36 and the bottom parts of the wings 35 are anchored in the layer 11, for example by the insert moulding technique. It will be noted that the track 14 is either at positive potential or at negative potential.

The wings 35 extend perpendicular to the layer 11 and are cooled by circulation of the air shown diagrammatically by an arrow in FIG. 2 so that the plate, by virtue of its wings, is a heat dissipating plate forming a heat dissipator.

On the condensation part 8 side, the heat pipe is fixed, in any suitable manner, for example by brazing or adhesive bonding, to the positive dissipator 4 of the bridge of diodes grouped in pairs, each pair comprising in a known fashion a positive diode and a negative diode.

However, the electronic component, such as the chip 12, of the voltage regulator, connected to the track 14, for example at a negative potential, and the positive dissipator 4 of the diode bridge have different electrical potentials, so that the use of a known heat pipe would cause a short-circuit between the two potentials.

Figure 3:
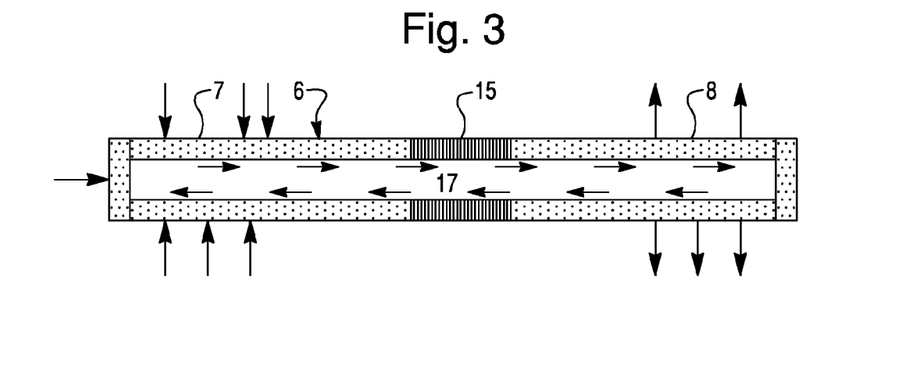
FIG. 3 is a view in section of the heat pipe of FIG. 1 mounted on the voltage regulator of FIG. 1.

To resolve this problem, it is proposed to use a heat pipe as shown in FIG. 3, which comprises between its evaporation 7 and condensation 8 parts an electrically insulating part 15 while preserving the qualities of thermal superconductor of the heat pipe. Thus the evaporator part and the condenser part of the heat pipe made from a thermally and electrically conductive material are separated by the electrically insulating part 15, these three parts put end to end being designed so as not to modify the transport of the heat-transfer fluid 17 inside the heat pipe for discharging the heat from the regulator to the dissipator 4, without risk of a short-circuit, by virtue of the insulating part 15.

For the record it is stated that the heat pipe 6 has a sealed chamber, here 7, 15, 8, inside which there is the heat-transfer fluid 17.

In an economical embodiment the parts 7, 8 are made from copper or nickel and the heat-transfer fluid 17 is water.

In another embodiment the heart-transfer fluid is ammonia and the parts 7, 8 made from nickel, aluminium or stainless steel.

In yet another embodiment the parts 7, 8 are made from nickel, copper or stainless steel and the heat transfer fluid is methanol.

Naturally the parts 7, 8 can be made from several materials.

For example the parts 7, 8 can be made from steel plated internally with copper, the heat-transfer fluid being water.

The insulating part 15 is in one embodiment made from plastics material.

In the embodiment in FIG. 3 the heat pipe is of the capillary pumping type.

The heat-transfer fluid 17 is in equilibrium with its vapour. There is a small quantity of liquid in contact with the parts 7, 15, 8 so that the parts 7 and 8 are well insulated electrically despite the presence of the liquid in the part 15.

In one embodiment these parts 7, 15, 8 are hollow in shape and provided with grooves for capillary pumping of the heat-transfer fluid.

This FIG. 3 depicts by arrows the circulation of the liquid 17 in the chamber 7, 15, 8 and outside the absorption of heat in the part 7 and the discharge of heat in the part 8 have also respectively been shown schematically by arrows.

It should be noted that a heat pipe as shown in FIG. 3 providing an electrically insulating part between its evaporation and condensation parts can be used, as a cooling means, in all cases of applications where the elements or devices to which the two parts of the heat pipe are connected have different electrical potentials. The heat pipe can have any suitable form, for example be a flat heat pipe or any other shape, provided that it comprises an electrically insulating part between these two evaporation and condensation parts.

When the heat pipe is flat it can have, on one of its faces, two evaporation parts separated by an electrically insulating part and on the other of its faces two condensation parts separated by an electrically insulating part.

The heat pipe therefore has at least one evaporation part and one condensation part separated by an electrically insulating part.

Likewise it is possible to modify the dissipator or dissipators 20, 4 in order to be able to fix the heat pipe by screwing, riveting, snapping on or clinching.

Figure 4:
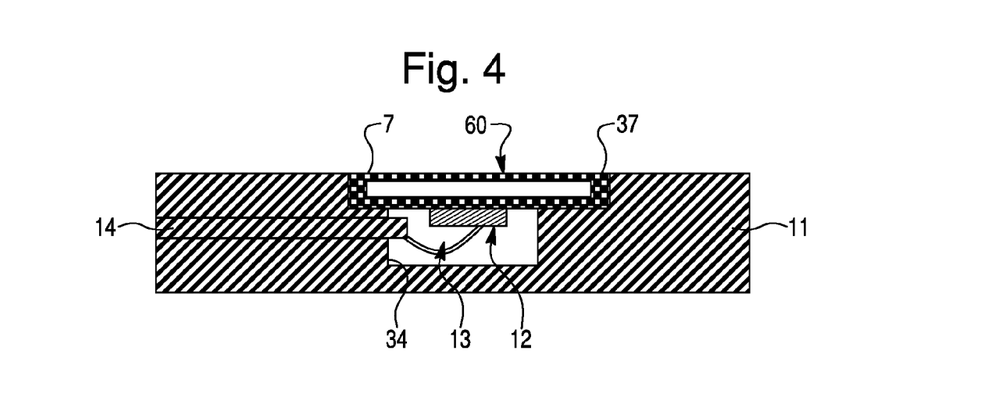
FIGS. 4 to 6 are views similar to FIG. 2 for respectively a second, third and fourth embodiment according to the invention.

In a variant, as can be seen in FIG. 4, the chip 12 is fixed directly, for example by adhesive bonding, to the evaporation part 7 of the heat pipe 60. In this case the heat pipe 60 is wider than the heat pipe 6 in FIG. 1 and the cavity 34 has a widened top part 37 for receiving the part 7.

The cavity 34 is therefore stepped.

Figure 5:
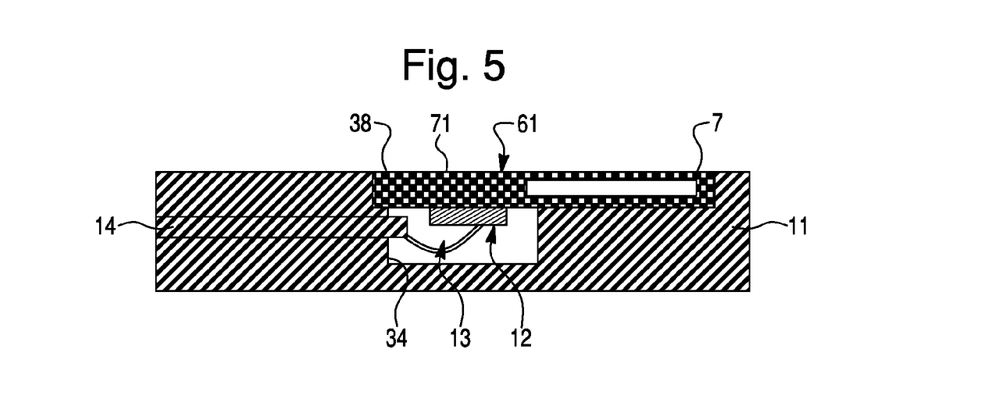

In a variant, as can be seen in FIG. 5, the top part 38 of the stepped cavity 34 is broadened further in order to house an even wider heat pipe 61 so that the evaporation zone 7 is offset with respect to the chip 12 fixed to a solid part 71 of the heat pipe adjacent to the evaporation part 7.

Naturally the present invention is not limited to the example embodiment described.

The rotor of the machine can be a projecting-pole rotor.

In a variant, as described in the document DE 40 187 10, the machine can comprise two claw rotors and two stators, the rectifying device, the voltage regulator and the B+ terminal being carried by the front bearing housing in the form of a cover.

The machine can be water cooled.

For example, one of the bearing housings of the casing can be provided with air passage openings so as to be cooled by a circulation of air created by a fan secured to the rotor or shaft, while the other bearing housing comprises at least one cooling chamber, such as a channel, connected to an outlet coupling so as to be cooled by circulation of a liquid. This cooling liquid may in one embodiment be the cooling liquid for the internal combustion engine, also referred to as the thermal engine, of the motor vehicle.

The bottom of the rear bearing housing or of the front bearing housing can therefore be cooled by circulation of a liquid.

The machine can be cooled solely by circulation of a liquid, the casing of the machine comprising in the aforementioned manner at least one cooling chamber for circulation of the cooling fluid as described in the document DE 40 187 10.

The fan can be located outside as in the documents DE A 30 12 636 and JP 56199707.

As a result, considering these two documents, the rectification device and the voltage regulator are in a variant carried by the front bearing housing of the machine casing or in a variant located between the bottom, for example of the rear bearing housing, and the rotor of the machine.

In a variant the rectification device and the voltage regulator can be located at the external periphery of the casing. In this case the cold source can be the casing so that the presence of the part 15 is not obligatory.

In a variant it is possible to double the number of components as can be seen in FIG. 2 of the aforementioned document DE 40 187 10.

In this case the heat pipe connects between the two regulators, constituting the hot source, to a cold source. The heat pipe can therefore have a T shape with a head formed by the two evaporation parts connected together.

The cold source is in a variant a portion of the casing of the machine cooled by circulation of liquid so that the presence of the part 15 is not necessary.

In the above embodiments the heat dissipated by the chip is discharged by forced convection via the heat pipe.

In a variant it is possible to discharge the heat by conduction in a cold part of the alternator.

Figure 6:
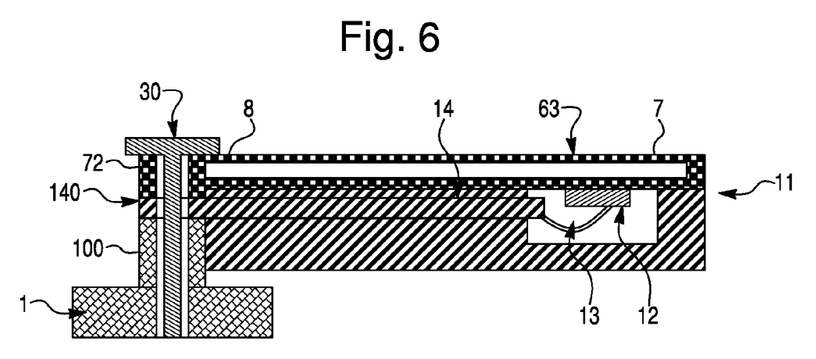

Thus, as can be seen in FIG. 6, it is possible to extend the track 14 so that the end 140 of this track 14, connected to the negative potential, comes into contact with the top face of a chimney 100 belonging to the rear bearing housing 1, here based on aluminium. The chimney 100 is in one embodiment cast in one piece with the metal rear bearing housing 1.

The heat pipe 63 is also extended so that its condensation zone 8 extends as far as the vicinity of the chimney 100.

More precisely the heat pipe 63 has a lug 72 adjacent to the condensation part 8 of the heat pipe 63 devoid here of the insulating part since the track 14 is at the same electrical potential as the rear bearing housing 8. This lug 72 is in contact with the top face of the end 140 of the track itself in abutment through its bottom face on the chimney 100. The end 140 of the track has a hole, not referenced, for the passage of a fixing member 30. This fixing member 30 is here a screw, the head of which bears on the lug 72 for clamping of the end 140 in contact with the threaded chimney 100 to cooperate with the thread on the screw 30. In a variant it is possible to use a stud screwed in the chimney 100 and a nut coming into contact with the lug 72.

Figure 7:
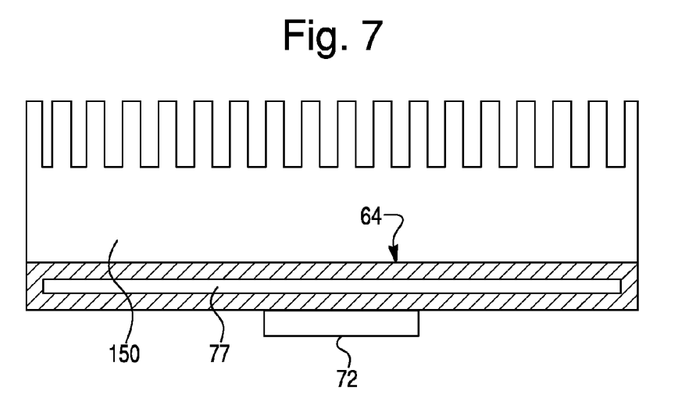
FIG. 7 is a schematic view of a cooling device according to the invention showing the use of a wide flat heat pipe.

FIG. 7 shows another possibility of implementing the invention, which consists of using a flat heat pipe 64, referred to as a "spreader heat pipe", in order to increase the heat transfer capacity. The chip 12 is fixed under the very wide shallow cavity of the heat pipe 64 and the latter is wedged between the chip and a large finned dissipator 150.

In another embodiment the condensation part of the heat pipe is located in a cooling chamber of the alternator through which a cooling liquid runs.

Figure 8:
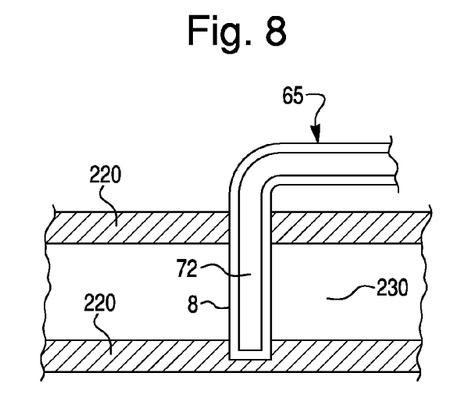
FIG. 8 is a schematic view of yet another embodiment of the cooling device according to the invention in which the heat pipe carrying the chip is connected to the casing of the electrical machine.

Thus, as can be seen in FIG. 8, the cooling of the regulator can be improved if the machine is cooled by a cooling liquid such as the cooling water of the thermal engine of the vehicle. A water pocket could then be provided for this purpose in the casing and the condensation part 8, then angled, of the heat pipe 63 will be immersed directly in the water, as shown schematically in FIG. 8, on which the references 220 and 230 designate respectively the walls of the water discharge channel and the internal space thereof.

The rotary electrical machine is in a variant an alternator starter, that is to say a reversible alternator making it possible also to transform electrical energy into mechanical energy in particular for starting the internal combustion engine of the motor vehicle. In this case the rectification device advantageously comprises transistors of the MOSFET type and may, in one embodiment, be mounted, along with the voltage regulator, in an external housing of the machine with the intervention of cables between the housing and the machine, as described in the document FR A 2 745 445, to which reference should be made.

Thus the brush holder can be distinct from the voltage regulator. The heat pipe according to the invention acts between the voltage regulator and the external housing containing the rectifying device and the voltage regulator. This housing comprises a bottom closed by a metal cover forming a heat dissipator. The heat pipe advantageously acts between the voltage regulator and the heat dissipator forming a cold source, its condensation part being connected to the heat dissipator or in a variant to a terminal carried by the housing and connected by a cable to the positive terminal of the battery.

Naturally all combinations are possible. Thus it is possible to reverse the structures, for example the track 14 is in one embodiment connected to the positive potential unlike the embodiments in FIGS. 2 and 4 to 5 in which the track 14 is connected to the negative potential. In the case where the track 14 is connected to the positive potential, the heat pipe can be devoid of any insulating part.

Likewise, as indicated in the aforementioned manner, the voltage regulator, the rectifying device and the terminal connecting with the positive terminal of the battery are in a variant carried by the front bearing housing of the casing of the machine or by the external periphery of the casing of the machine or a housing external to the machine, which in a variant is cooled by liquid circulation.

The voltage regulator can be provided with several positive and negative tracks 14, in particular to also connect the chip to the positive potential.

Figure 9:
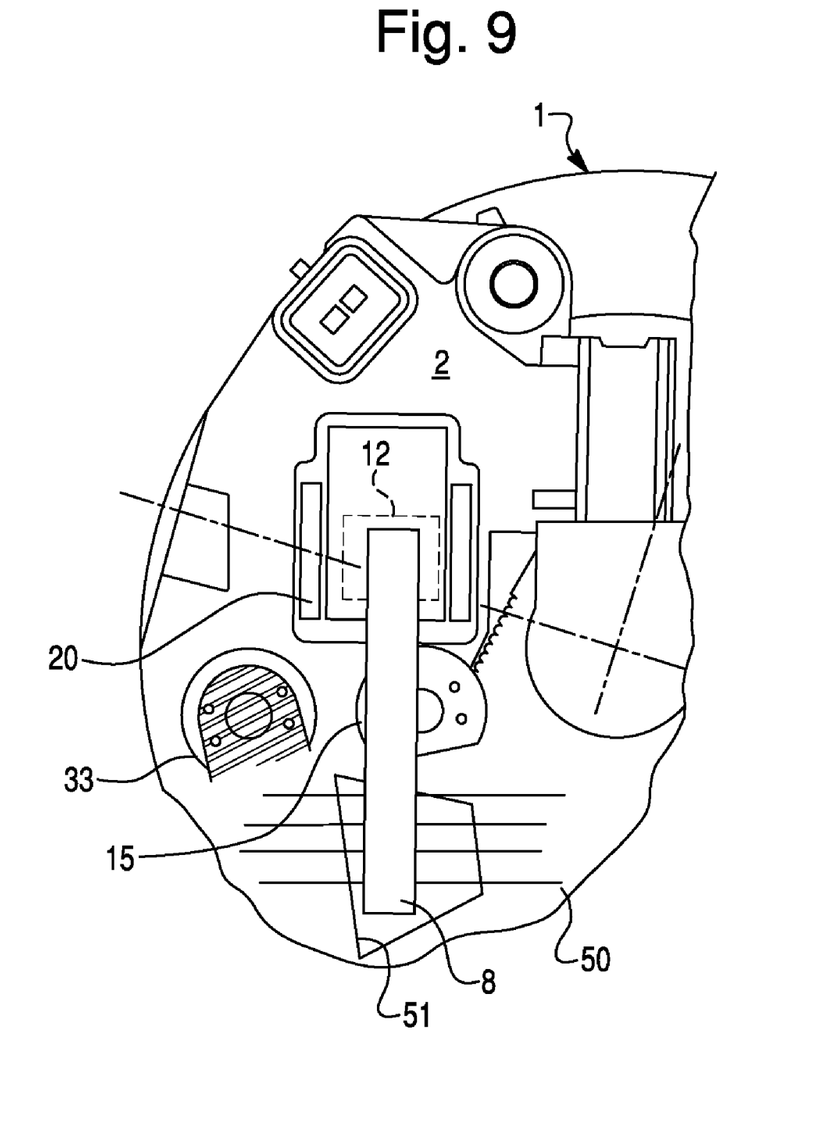
FIG. 9 is a view similar to FIG. 1 for a fifth embodiment of the invention.

In a variant, as can be seen in FIG. 9, the evaporation part 7 is connected to the chip 12 at the positive potential while the condensation part 8 carries fins 50 opposite an air passage opening 51 provided here in the rear bearing housing 1 for circulation of air inside the machine under the action of at least one fan secured to the rotor or to the shaft of the machine. By virtue of the electrical insulating part 15, interposed between the parts 7, 8, any short-circuit in the case where the fins and/or the condensation part come into contact with the bearing 1 at the negative potential is avoided. It should be noted that the part 8 is well cooled since it is located opposite the opening 15 and carries fins 50.

The condensation part of the heat pipe is therefore placed in the path of the cooling air flow level with the axial opening 51.

In a variant the part 8 of the heat pipe is placed in the path of the cooling air flow level with the radial outlet opening, which the bearing housing 1 has at its axially oriented external periphery.

Naturally, in a variant to FIG. 1, the positive dissipator 4 can be equipped with an additional heat pipe, for example a heat pipe whose condensation zone, advantageously equipped with fins, extends opposite an opening in the front or rear bearing housing provided for the passage of air, the circulation of which is achieved by means of at least one fan internal or external to the machine.

Concerning the fixing of the heat pipe to the dissipator, it is possible to envisage, in the aforementioned manner, as a fixing means, adhesive bonding or brazing. For brazing, it is necessary to pay attention to the temperature of the brazing, in particular if the heat pipe is fixed after the chip is fixed to the dissipator, as can be seen in FIG. 2. It would also be possible to envisage adapting the shape of the dissipator in order to be able to fix the heat pipe to it by means of screwing, riveting, clipping or clinching. If the chip is directly in contact with the heat pipe, as in the cases in FIGS. 4 to 7, it will be brazed or adhesively bonded. By placing the chip alongside the cavity in the heat pipe, in accordance with FIG. 5, the brazing can be done by means of a laser.

The adhesive used is advantageously heat conducting. It can also, in one embodiment, be electrically insulating.

The heat pipe can constitute an electrical connection means when these two parts are at the same electrical potential. For example when the part 7 is mounted on the regulator in the aforementioned manner and the part 8 is mounted in on the rear bearing.

Naturally all the characteristics stated above are to be considered in isolation or in combination.

The invention claimed is:

1. A cooling device comprising:
a heat pipe including evaporation and condensation parts situated respectively in a hot zone and a cold zone;
the heat pipe being intended to discharge the heat from the hot zone to the cold zone;
the evaporation part of the heat pipe being connected to a voltage regulator of a rotary electrical machine, such as an alternator or an alternator starter;
the rotary electrical machine comprising a casing provided with a front bearing housing and a rear bearing housing;
the condensation part of the heat pipe being connected to one of the front and rear bearing housings constituting a cold source;
the voltage regulator mounted to one of the front bearing housing and the rear bearing housing external to the rotary electrical machine;
one of the front bearing housing and the rear bearing housing carrying at least one current rectification device and comprising a heat dissipator carrying rectifying elements of the at least one current rectification device; and
the condensation part of the heat pipe being in contact with the heat dissipator.

2. The device according to claim 1, wherein the condensation part (8) of the heat pipe (63) is connected to a chimney (100) secured to the rear bearing housing (1).

3. The device according to claim 1, wherein the heat pipe comprises, between its condensation and evaporation parts, an electrically insulating part so that the hot and cold zones are electrically insulated from each other.

4. The device according to claim 3, wherein the heat dissipater is a positive dissipator carrying positive rectifying elements, such as diodes or transistors of the MOSFET type, and wherein the condensation part of the heat pipe is connected to the positive dissipator.

5. The device according to claim 4, wherein the positive dissipator is electrically insulated by the rear bearing housing of the rotary electrical machine.

6. The device according to claim 1, wherein the voltage regulator comprises at least one electronic regulation component fixed directly or indirectly to the evaporation part of the heat pipe.

7. A cooling device comprising:
a heat pipe including evaporation and condensation parts situated respectively in a hot zone and a cold zone;
the heat pipe being intended to discharge the heat from the hot zone to the cold zone;
the evaporation part of the heat pipe being connected to a voltage regulator of a rotary electrical machine, such as an alternator or an alternator starter;
the heat pipe comprises, between condensation and evaporation parts thereof, an electrically insulating part so that the hot and cold zones are electrically insulated from each other;
the rotary electrical machine comprising a casing provided with a front bearing housing and a rear bearing housing;
one of the front bearing housing and the rear bearing housing carrying at least one current rectification device and comprising a positive dissipator carrying positive rectifying elements, such as diodes or transistors of the MOSFET type;
the condensation part of the heat pipe being connected to the positive dissipater;
the positive dissipator being electrically insulated by the rear bearing housing of the rotary electrical machine;
the positive dissipator having a lug serving for the mounting of a terminal intended to be connected to the positive terminal of a battery via a cable;
the condensation part of the heat pipe located close to the lug.

8. A cooling device comprising:
a heat pipe including evaporation and condensation parts situated respectively in a hot zone and a cold zone;
the heat pipe being intended to discharge the heat from the hot zone to the cold zone;
the evaporation part of the heat pipe being connected to a voltage regulator of a rotary electrical machine, such as an alternator or an alternator starter;
the voltage regulator comprises at least one electronic regulation component fixed directly or indirectly to the evaporation part of the heat pipe;
the voltage regulator comprising a layer of plastics material provided with a cavity for housing the electronic regulation component.

9. The device according to claim 8, wherein the voltage regulator includes at least one metal electrical connection track extending in the layer of plastics material and connected to the electronic regulation component and to a reference potential.

10. The device according to claim 9, wherein the rotary electrical machine comprises a casing provided with a rear bearing housing carrying the voltage regulator, and wherein the condensation part of the heat pipe is connected to a chimney secured to the rear bearing housing.

11. The device according to claim 10, wherein an end of the electrical connection track 14 comes into contact with a top face of the chimney.

12. The device according to claim 11, wherein the electrical connection track is as the same potential as the rear bearing housing 1 and wherein the heat pipe 63 has a lug 72 adjacent to the condensation part of the heat pipe devoid of insulating part.

13. The device according to claim 12, wherein the lug 72 is in contact with the top face of the end 140 of the track and wherein the end 140 of the track is in abutment through its bottom face on the chimney 100.

14. The device according to claim 13, wherein the end 140 of the track 14 has a hole for the passage of a fixing member 30.

15. The device according to claim 8, wherein the electronic regulation component is connected by an electrical connection wire 13 to at least one metal electrical connection track 14.

16. A cooling device comprising:
a heat pipe including evaporation and condensation parts situated respectively in a hot zone and a cold zone;
the heat pipe being intended to discharge the heat from the hot zone to the cold zone;
the evaporation part of the heat pipe being connected to a voltage regulator of a rotary electrical machine, such as an alternator or an alternator starter;
the heat pipe comprising an electrically insulating part disposed between the condensation and evaporation parts thereof so as to electrically insulate the hot and cold zones from each other;
the rotary electrical machine comprising a casing provided with a front bearing housing and a rear bearing housing, one of the front and rear bearing housings carrying at least one current rectification device comprising a positive dissipator carrying rectifying elements including diodes or transistors of the MOSFET type;

the condensation part of the heat pipe being connected to the positive dissipator;

the positive dissipator being electrically insulated by the rear bearing housing of the rotary electrical machine;

the positive dissipator having a lug serving for the mounting of a terminal intended to be connected to the positive terminal of a battery via a cable; and the condensation part of the heat pipe being located close to the lug.

* * * * *